United States Patent
Jeong

(10) Patent No.: US 8,101,958 B2
(45) Date of Patent: Jan. 24, 2012

(54) SEMICONDUCTOR LIGHT-EMITTING DEVICE

(75) Inventor: Hwan Hee Jeong, Ulsan (KR)

(73) Assignee: LG Innotek Co., Ltd., Seoul (KR)

( * ) Notice: Subject to any disclaimer, the term of this patent is extended or adjusted under 35 U.S.C. 154(b) by 77 days.

(21) Appl. No.: 12/625,340

(22) Filed: Nov. 24, 2009

(65) Prior Publication Data

US 2010/0127297 A1    May 27, 2010

(30) Foreign Application Priority Data

Nov. 25, 2008  (KR) .................. 10-2008-0117580

(51) Int. Cl.
*H01L 21/00* (2006.01)

(52) U.S. Cl. ....... 257/89; 257/98; 257/99; 257/E21.261; 257/E21.273; 257/E31.043

(58) Field of Classification Search .................. 257/40, 257/89, 98, 99
See application file for complete search history.

(56) References Cited

U.S. PATENT DOCUMENTS

| | | | |
|---|---|---|---|
| 6,319,778 B1 | 11/2001 | Chen et al. | |
| 6,420,197 B1 | 7/2002 | Ishida et al. | |
| 6,930,450 B2 * | 8/2005 | Park et al. | 313/512 |
| 7,661,846 B2 * | 2/2010 | Hsiao et al. | 362/249.04 |
| 2005/0045897 A1 * | 3/2005 | Chou et al. | 257/98 |
| 2007/0114519 A1 * | 5/2007 | Hayashi | 257/40 |
| 2010/0163908 A1 | 7/2010 | Jang et al. | |

FOREIGN PATENT DOCUMENTS

| | | |
|---|---|---|
| JP | 2005-158846 A | 6/2005 |
| JP | 2007-027540 * | 2/2007 |
| KR | 10-2000-0058188 A | 9/2000 |
| KR | 10-2007-0094047 A | 9/2007 |
| KR | 10-2008-0028070 A | 3/2008 |
| KR | 10-2008-0047836 A | 5/2008 |
| KR | 10-2008-0098812 A | 11/2008 |

* cited by examiner

*Primary Examiner* — Michael Lebentritt

(74) *Attorney, Agent, or Firm* — Birch, Stewart, Kolasch & Birch, LLP

(57) ABSTRACT

Embodiments relate to a semiconductor light-emitting device. The semiconductor light-emitting device comprises a plurality of compound semiconductor layers including a first conductive semiconductor layer; an active layer on the first conductive semiconductor layer; and a second conductive semiconductor layer on the active layer; an electrode under the plurality of compound semiconductor layers; an electrode portion on the plurality of compound semiconductor layers; and a bending i0 prevention member comprising a pattern on the plurality of compound semiconductor layers.

20 Claims, 9 Drawing Sheets

US 8,101,958 B2

SEMICONDUCTOR LIGHT-EMITTING DEVICE

CROSS-REFERENCE TO RELATED APPLICATIONS

The present application claims priority under 35 U.S.C. 119 to Korean Patent Application No. 10-2008-0117580 (filed on Nov. 25, 2008), which is hereby incorporated by reference in its entirety.

BACKGROUND

The present disclosure relates to a semiconductor light-emitting device.

Group III-V nitride semiconductors have been in the spotlight as a core material for light emitting devices, such as light emitting diodes (LEDs), laser diodes (LDs), and the like, due to excellent physical and chemical properties thereof. The III-V nitride semiconductor includes a semiconductor material having the formulan $in_xAl_yGa_{1-x-y}N$ (where $0 \leq x \leq 1$, $0 \leq y \leq 1$, $0 \leq x+y \leq 1$).

A Light Emitting Diode (LED) is a kind of semiconductor device that converts electricity into infrared rays or light using the characteristics of a compound semiconductor to transmit and receive a signal, or is used as a light source.

The LEDs or LDs made of these nitride semiconductor materials are extensively adopted in light emitting devices for obtaining light, and are applied as a light source for various products such as a keypad light emitting diode of a mobile phone, an electrical sign board, and a lighting device.

SUMMARY

Embodiments provide a semiconductor light-emitting device comprising a bending prevention member within an electrode portion on a light-emitting structure.

Embodiments provide a semiconductor light-emitting device to prevent the bending of a plurality of semiconductor layers by using a bending prevention member using a plurality of patterns.

Embodiments provide a semiconductor light-emitting device to improve a bending problem using a high-melting point metal pattern corresponding to a bending prevention pattern and an electrode on a light-emitting structure.

An embodiment provides a semiconductor light-emitting device comprising: a plurality of compound semiconductor layers including a first conductive semiconductor layer; an active layer on the first conductive semiconductor layer; and a second conductive semiconductor layer on the active layer; an electrode under the plurality of compound semiconductor layers; an electrode portion on the plurality of compound semiconductor layers; and a bending prevention member comprising a pattern on the plurality of compound semiconductor layers.

An embodiment provides a semiconductor light-emitting device comprising: a plurality of compound semiconductor layers including a first conductive semiconductor layer; an active layer on the first conductive semiconductor layer; and a second conductive semiconductor layer on the active layer; an electrode under the plurality of compound semiconductor layers; an reflective electrode layer on the plurality of compound semiconductor layers; a conductive supporting member on the reflective electrode layer; a first bending prevention member comprising a pattern between the reflective electrode layer and the conductive supporting member; and a channel layer disposed on a peripheral portion of the plurality of the compound semiconductor layers.

The details of one or more embodiments are set forth in the accompanying drawings and the description below. Other features will be apparent from the description and drawings, and from the claims.

DETAILED DESCRIPTION OF THE EMBODIMENTS

Reference will now be made in detail to the embodiments of the present disclosure, examples of which are illustrated in the accompanying drawings. In description of embodiments, the 'on' or 'under' of each layer may be described with reference to the accompanying drawings, and the thickness of the each layer will also be described as an example and is not limited to the thickness of the accompanying drawings.

In description of embodiments, it will be understood that in a case where a layer (or film), a region, a pattern, or components is referred to as being 'on' or 'under' another substrate, layer (or film), region or patterns, the 'on' and 'under' include all the meanings of 'directly' and 'indirectly'.

Figure 1:
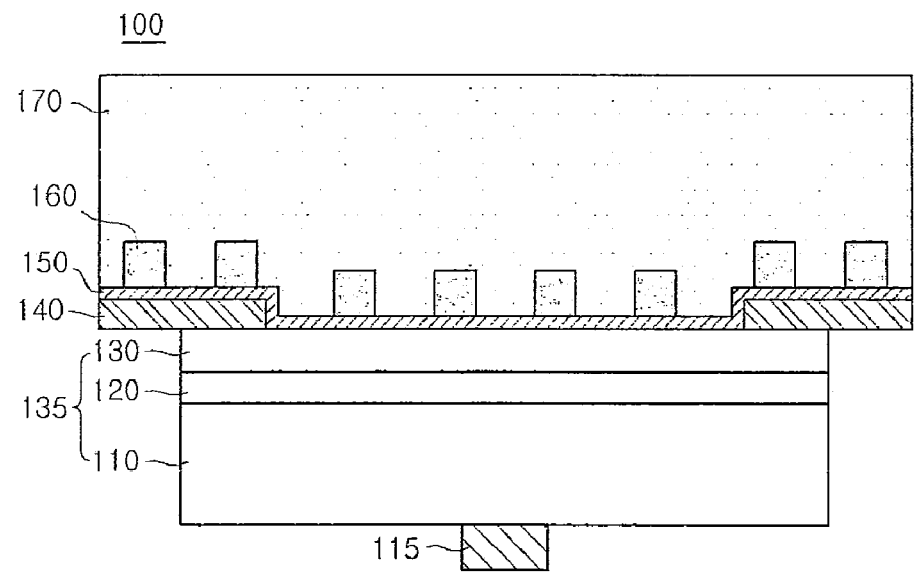
FIG. 1 is a side-sectional view of a semiconductor light-emitting device according to a first embodiment.

FIG. 1 is a side-sectional view of a semiconductor light-emitting device according to a first embodiment.

Figure 2:
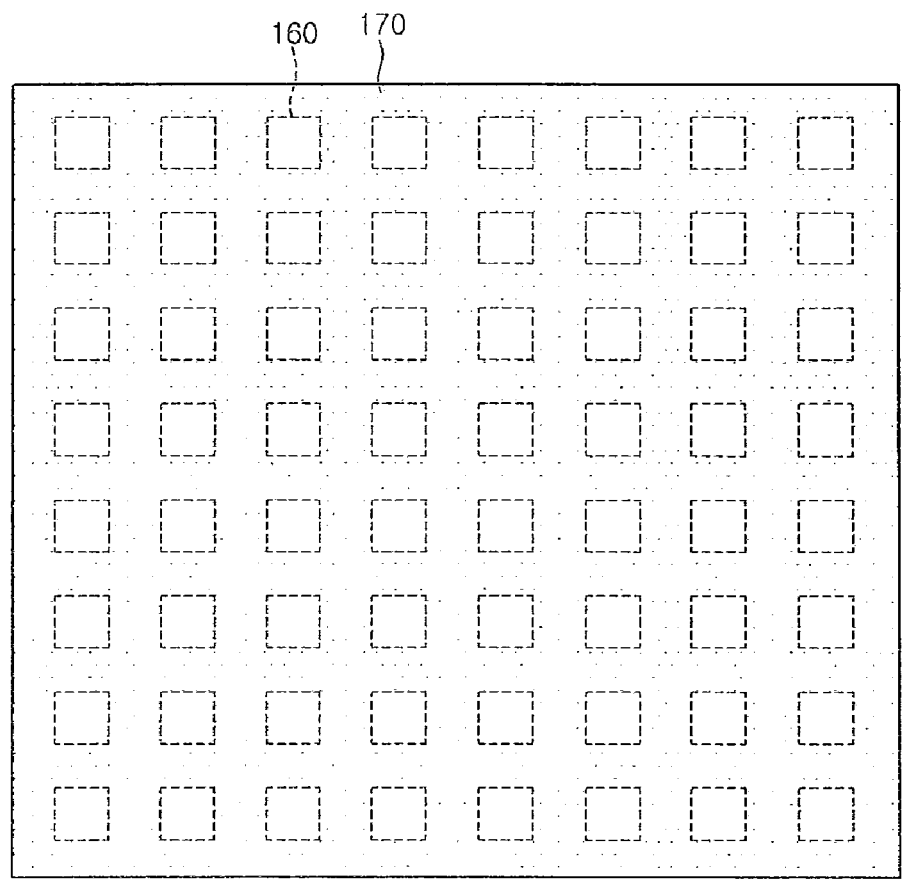
FIGS. 2 to 5 are diagrams illustrating pattern examples of a bending prevention member according to a first embodiment.

Referring to FIGS. 1 to 2, a semiconductor light-emitting device 100 includes a first conductive semiconductor layer 110, an active layer 120, a second conductive semiconductor layer 130, a channel layer 140, an electrode layer 150, a bending prevention member 160, a conductive supporting member 170, and an electrode 115.

The light-emitting structure 100 includes an LED using a multiplicity of compound semiconductor layers, for example, group III-V compound semiconductors, and the LED may be a colored LED or a UV LED which emits blue light, green light, or red light. Light emitted by the LED may be diversely implemented within the technical scope of embodiments.

The plurality of compound semiconductor layers comprise a first conductive semiconductor layer 110, an active layer 120, and a second conductive semiconductor layer 130.

The first conductive semiconductor layer 110 may be formed of at least one of the compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. In a case where the first conductive semiconductor layer 110 is an N-type semiconductor, the first conductive dopant includes an N-type dopant such as si, Ge, Sn, Se, and Te. The first conductive semiconductor layer 110 may be formed in a mono- or multi-layer, but is not limited thereto.

An electrode 115 is formed under the first conductive semiconductor layer 110, and the electrode 115 may be formed in a predetermined pattern with a predetermined shape, but is not limited thereto. The position of the electrode 115 may be disposed at the center side of the bottom region of the first conductive semiconductor layer 110 for current supply, and the shape may be formed in a circular shape or a polygon shape. The electrode 115 may function as an electrode of the first conductive semiconductor layer 110 or form a separate electrode, but is not limited thereto.

The electrode 115 may be formed using a material selected from the group consisting of, but is not limited to, Ti, Al, In, Ta, Pd, Co, Ni, Si, Ge, Ag, and Au.

The active layer 120 is formed on the first conductive semiconductor layer 110, and may be formed in a single quantum well structure or a multiple quantum well structure. The active layer 120 may be periodically formed by the structure of a well layer and a barrier layer, for example, an InGaN well layer/GaN barrier layer by using the compound semiconductor material of group III-V elements. A conductive clad layer may be formed on and/or under the active layer 120, and the conductive clad layer may be formed of an AlGaN-based semiconductor.

The second conductive semiconductor layer 130 is formed on the active layer 120, and may be formed of at least one of the compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. In a case where the second conductive semiconductor layer 130 is a P-type semiconductor, the second conductive dopant includes a P-type dopant such as Mg and Zn. The second conductive semiconductor layer 130 may be formed in a single layer or multi-layer, but is not limited thereto.

The first conductive semiconductor layer 110, the active layer 120, and the second conductive semiconductor layer 130 may be defined as a light-emitting structure 135.

An N-type semiconductor layer (not shown) or a P-type semiconductor layer (not shown) may be also provided on the second conductive layer 120. In addition, the first conductive semiconductor layer 110 may include a P-type semiconductor layer, while the second conductive semiconductor layer 130 may include an N-type semiconductor layer. Accordingly, the light-emitting structure 135 may include at least one selected from the group consisting of an N-P junction, a P-N junction, an N-P-N junction, and a P-N-P junction.

The channel layer 140 is formed on the top perimeter of the second conductive semiconductor layer 130. The first insulating layer 140 may be formed in a continuous pattern with a belt shape, a loop shape, and a frame shape on the perimeter region of the second conductive semiconductor layer 130.

The channel layer 140 may be formed in an insulating layer or a transparent conductive layer, which may include at least one selected from the group consisting of $SiO_2$, $SiO_x$, $SiO_xN_y$, $Si_3N_4$, $Al_2O_3$, $TiO_2$, ITO (indium tin oxide), Indium Zinc Oxide (IZO), Indium Zinc Tin Oxide (IZTO), Indium Aluminum Zinc Oxide (IAZO), Indium Gallium Zinc Oxide (IGZO), Indium Gallium Tin Oxide (IGTO), Aluminum Zinc Oxide (AZO), Antimony Tin Oxide (ATO), Gallium Zinc Oxide (GZO), IrOx, RuOx, RuOx/ITO, Ni/IrOx/Au, and Ni/IrOx/Au/ITO.

The channel layer 140 may use not only the material, but also a material through which laser light is transmitted or a material with little debris generated by laser light. In addition, the channel layer 140 may improve adhesive force with a material for the second conductive semiconductor layer 130. The channel layer 140 may be formed with a width or thickness of 2 μm or less, but is not limited thereto.

The outer perimeter of the first conductive semiconductor layer 110, the active layer 120, and the second conductive semiconductor layer 130 is etched to expose the outer side of the channel layer 140. Accordingly, the channel layer 140 may separate the electrode layer 150 from the second conductive semiconductor layer 130.

A laser irradiated during the manufacturing process is transmitted through the channel layer 140 to solve the side delaminating of the light-emitting structure 135. The channel layer 140 may also prevent metal debris generated by the electrode layer 150 or the conductive supporting member 160 from being introduced into the outer side of the semiconductor layer 110, 120, and 130. In addition, the 140 may prevent moisture from being penetrated into the outer side of the semiconductor layer 110, 120, and 130.

An electrode portion may be formed on the channel layer 140 and the second conductive semiconductor layer 130. The electrode portion includes the electrode layer 150 and the conductive supporting member 170, and a bending prevention member 160 is arranged in a plurality of patterns within the electrode portion.

The electrode layer 150 is formed at the inner side of the top of the second conductive semiconductor layer 130, and may function as a reflective electrode layer. A material for the electrode layer 150 may be formed of a material selected from the group consisting of Ag, Ni, Al, Rh, Pd, Ir, Ru, Mg, Zh, pt, Au, Hf, and a selective combination thereof.

In addition, the electrode layer 150 may be formed of a reflective electrode material having ohmic characteristics, or an ohmic contact layer (not shown) may be formed between the electrode layer 150 and the second conductive semiconductor layer 130. The ohmic contact layer may be formed in a layer or a plurality of patterns, and its material may include at least one selected from the group consisting of, but is not limited to, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

The bending prevention member 160 is formed in a predetermined pattern on the electrode layer 150. The bending prevention member 160 may be formed by selectively using material with a predetermined strength, a heat-resistant material, an insulating material, and a conductive material.

The bending prevention member 160 may be formed by selectively using an insulating material including nitride or oxide, for example, $SiO_2$, $Si_3N_4$, $Al_2O_3$, $TiO_2$, $SiO_x$, $SiN_x2$, $SiN_x$, and $SiO_xN_y$.

The thickness of the bending prevention member 160 may range from about 100 nm to about 10 μm, and the width may be varied according to the size or electrical characteristics of the chip.

The bending prevention member 160 may be formed in a pattern with a predetermined shape, such as a pattern with a dot matrix shape using a column shape, a rod shape, a semi-circular shape, and a concentric circular shape, a pattern which is crossed at least once a shape such as cross shape or lattice shape, and a pattern with a stripe shape, and the pattern shape may be modified.

The conductive supporting member 170 may be formed on the bending prevention member 160 and the electrode layer 150. The conductive supporting member 170 may function as a base substrate, and its material may include copper (Cu), gold (Au), nickel (Ni), molybdenum (Mo), copper-tungsten (Cu—W), and carrier wafer such as Si, Ge, GaAs, ZnO, SiC, $Ga_2O_3$, SiGe, and GaN. The conductive supporting member 160 may be formed by an electroplating technique or in the form of a sheet, but is not limited thereto. The conductive supporting member 170 may be formed with a thickness of about 30 µm to about 150 µm, but is not limited thereto.

Herein, the bending prevention member 160 may be arranged in a plurality of patterns between the electrode layer 150 and the conductive supporting member 170 to provide an entire region of the semiconductor light-emitting device 100 with a predetermined strength. For example, when a wire bonding is performed through the electrode 115, the bending of the LED chip is prevented from a shock caused by the bonding equipment. In addition, the bending prevention member 160 may prevent the bending of the LED chip from heat generated by the LED chip and improve degradation of chip characteristics, such as fracture or delaminating of the LED chip.

FIGS. 2 to 5 are diagrams illustrating pattern examples of a bending prevention member according to a first embodiment.

Referring to FIG. 2, a bending prevention member 160 may be formed in a dot matrix shape of uniformly-sized rectangular column patterns arranged at regular intervals. The pattern interval of the bending prevention member 160 may be formed at regular or irregular intervals, and the shape may be formed in a polygonal column shape such as a triangular column and a pentagonal column.

Figure 3:
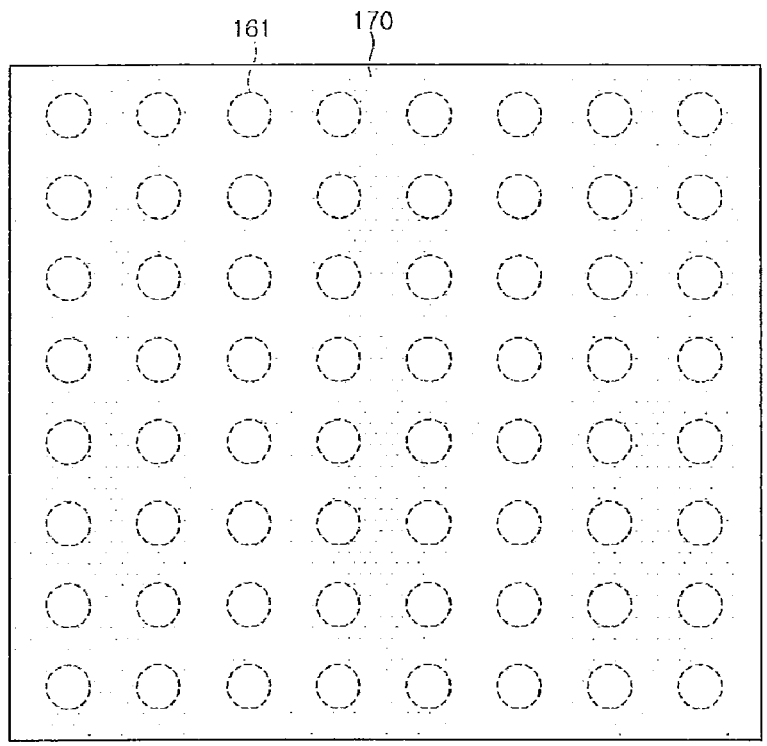

Referring to FIG. 3, a bending prevention member 161 may be formed in a dot matrix shape of circular column patterns with a predetermined diameter arranged at regular intervals. In addition, the pattern interval of the bending prevention member 161 may be formed at regular or irregular periods. In addition, the bending prevention member 161 may be formed in a column shape with a predetermined curvature, such as a circular column and an elliptical column.

Figure 4:
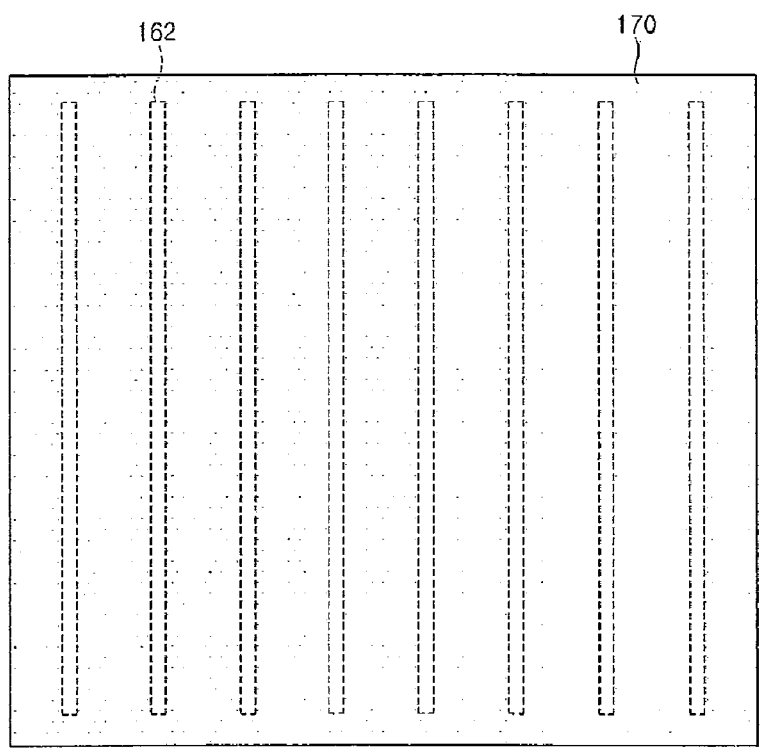

Referring to FIG. 4, a bending prevention member 162 may be formed in a stripe shape of parallel rod shape patterns arranged at regular intervals. The pattern interval of the bending prevention member 162 may be formed at regular or irregular intervals. In addition, the cross-section of the bending prevention member 162 may be a rectangular column or a semispherical shape, but is not limited thereto.

Figure 5:
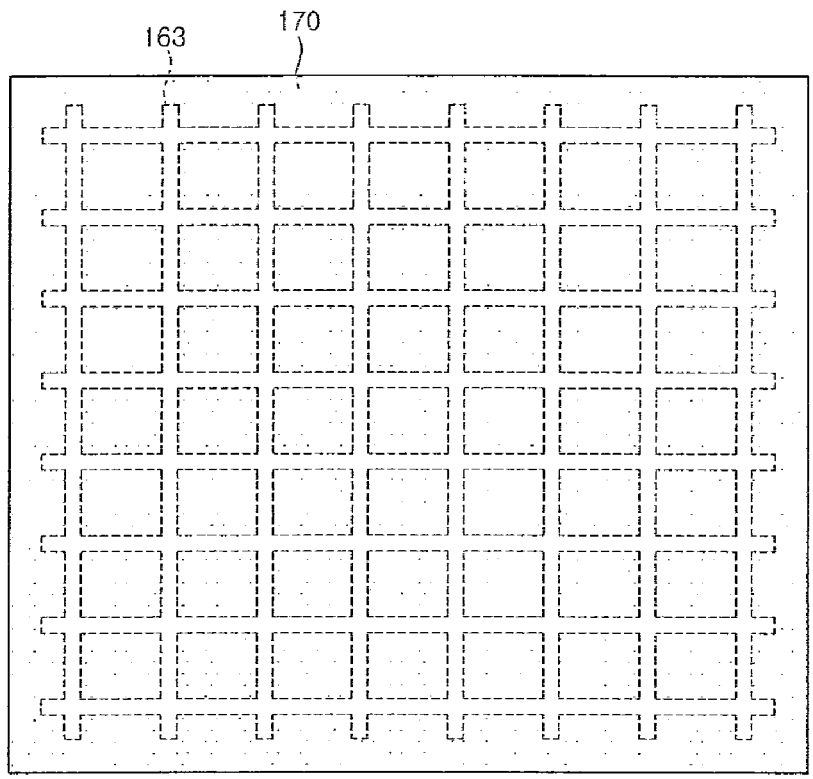

Referring to FIG. 5, a bending prevention member 163 may be formed in a lattice shape of parallel patterns where a first direction is crossed at a right angle with a second direction. The lattice shape may include a structure in which a pattern is crossed with another pattern at least once, the shape with which the two directions are crossed may be crossed at a right angle or a predetermined angle, but is not limited thereto.

FIGS. 6 to 12 are diagrams illustrating a process of manufacturing the semiconductor light-emitting device in FIG. 1.

Figure 6:
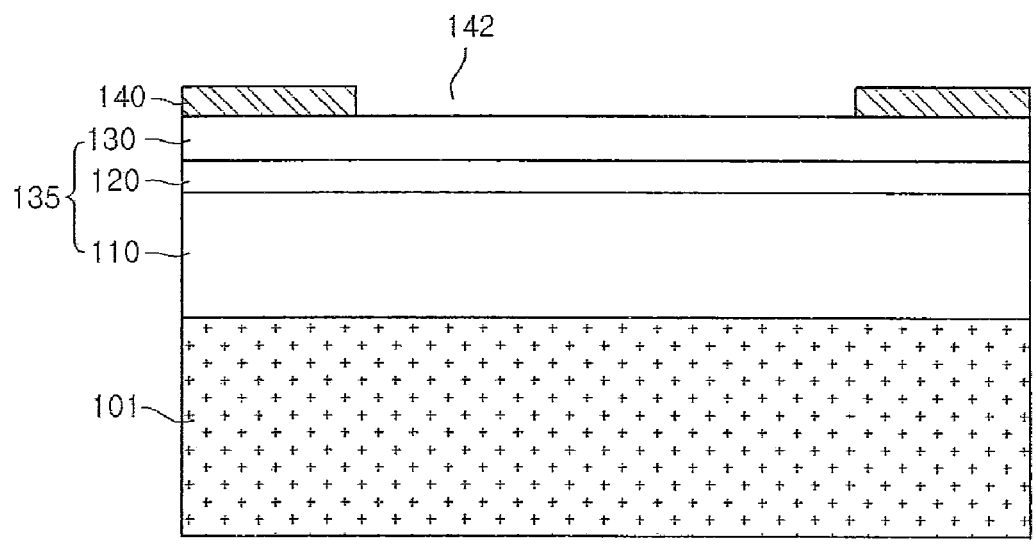
FIGS. 6 to 12 are diagrams illustrating a process of manufacturing a semiconductor light-emitting device in FIG. 1.

Referring to FIG. 6, a substrate 101 is loaded into growth equipment, and a compound semiconductor layer of group II to group VI elements is formed thereon.

The growth equipment may include an electron beam evaporator, physical vapor deposition (PVD), chemical vapor deposition (CVD), plasma laser deposition (PLD), dual-type thermal evaporator, sputtering and metal organic chemical vapor deposition (MOCVD), but is not limited thereto.

The substrate 101 may be selected from the group consisting of sapphire substrate ($Al_2O_3$), GaN, SiC, ZnO, Si, GaP, InP, $Ga_2O_3$, conductive substrate, and GaAs. A concave-convex pattern may be formed on the top of the substrate 101. A layer or pattern using a compound semiconductor of group II to group VI elements, for example, at least one selected from the group consisting of ZnO layer (not shown), buffer layer (not shown), and undoped semiconductor layer (not shown) may be formed.

The buffer layer and the undoped semiconductor layer may be formed using a compound semiconductor of group III-V elements, the buffer layer may decrease a lattice constant difference with the substrate, and the undoped semiconductor layer may be formed of an undoped GaN-based semiconductor.

A light-emitting structure 135 including a plurality of compound semiconductor layers is formed on the substrate 101. The light-emitting structure 135 includes a first conductive semiconductor layer 110, an active layer 120, and a second conductive semiconductor layer 130. The first conductive semiconductor layer 110 is formed on the substrate 101 or another semiconductor layer, the active layer 120 is formed on the first conductive semiconductor layer 110, and the second conductive semiconductor layer 130 is formed on the active layer 120.

The first conductive semiconductor layer 110 may be formed of at least one of the compound semiconductors of group III-V elements doped with a first conductive dopant, for example, GaN, AlN, AlGaN, InGaN, InN, InAlGaN, AlInN, AlGaAs, GaP, GaAs, GaAsP, and AlGaInP. In a case where the first conductive semiconductor layer 110 is an N-type semiconductor, the first conductive dopant includes an N-type dopant such as si, Ge, Sn, Se, and Te. The first conductive semiconductor layer 110 may be formed in a mono- or multi-layer, but is not limited thereto.

An active layer 120 is formed on the first conductive semiconductor layer 110, and the active layer 120 may be formed in a single quantum well structure or a multiple quantum well structure. The active layer 120 may be periodically formed by the structure of a well layer and a barrier layer, for example, an InGaN well layer/GaN barrier layer by using the compound semiconductor material of group III-V elements.

A conductive clad layer may be formed on and/or under the active layer 120, and the conductive clad layer may be formed of an AlGaN-based semiconductor.

The second conductive semiconductor layer 130 is formed on the active layer 120, and the second conductive semiconductor layer 130 may be formed of at least one of the compound semiconductors of group III-V elements doped with a second conductive dopant, for example, GaN, AlN, AlGaN, InGaN, InN, InAlGaN, AlInN, AlGaAs, GaP, GaAs, GaAsP, and AlGaInP. In a case where the second conductive semiconductor layer 130 is a P-type semiconductor, the second conductive dopant includes a P-type dopant such as Mg and Zn. The second conductive semiconductor layer 130 may be formed in a single layer or multi-layer, but is not limited thereto.

In addition, a third conductive semiconductor layer (not shown), for example, an N-type semiconductor layer or a P-type semiconductor layer may be formed on the second conductive semiconductor layer 130. Accordingly, at least one selected from the group consisting of an N-P junction, a P-N junction, an N-P-N junction, and a P-N-P junction structure may be formed in the light-emitting structure 135.

A mask pattern is used on the second conductive semiconductor layer 130 to form a channel layer 140. The channel layer 140 is formed along the outer perimeter of the top of the second conductive semiconductor layer 130, and the shape may be formed in a continuous pattern such as a belt shape, a loop shape, a frame shape, and closed loop shape.

The channel layer 140 may be formed of a transparent insulating layer or a transparent conductive layer, and its material includes at least one selected from the group consisting of $SiO_2$, $SiO_x$, $SiO_xN_y$, $Si_3N_4$, $Al_2O_3$, $TiO_2$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

The channel layer 140 may be formed of not only the materials, but also materials transmitted by laser light or materials with little debris generated by laser light, but is not limited thereto. In addition, the channel layer 140 may be formed of a material having a good adhesive force with the second conductive semiconductor layer 130. The channel layer 140 may be formed with a width or thickness of 2 µm or less, but is not limited thereto.

The inner region 142 of the second conductive semiconductor layer 130 is exposed.

Figure 7:
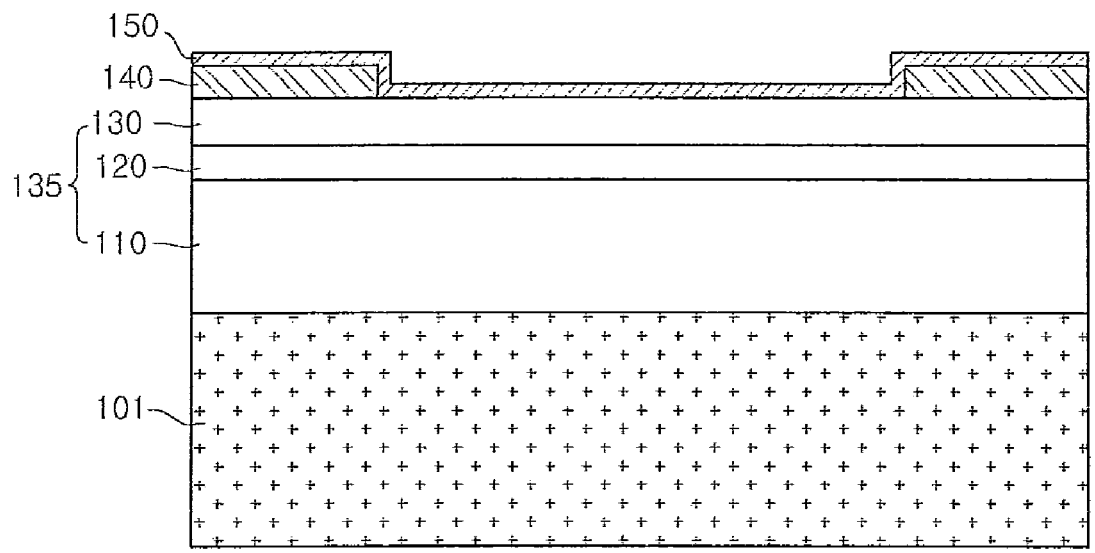

Referring to FIG. 7, an electrode layer 150 is formed on the second conductive semiconductor layer 130 on some regions or entire regions. The electrode layer 150 may be formed of a material having at least one characteristic of seed metal, ohmic metal, and reflective metal. The electrode layer 150 may function as a reflective electrode layer, and its material include at least one selected from the group consisting of Ag, Ni, Al, Rh, Pd, Ir, Ru, Mg, Zn, Pt, Au, Hf, and a selective combination thereof.

The electrode layer 150 may be extended and formed on the channel layer 140.

Figure 8:
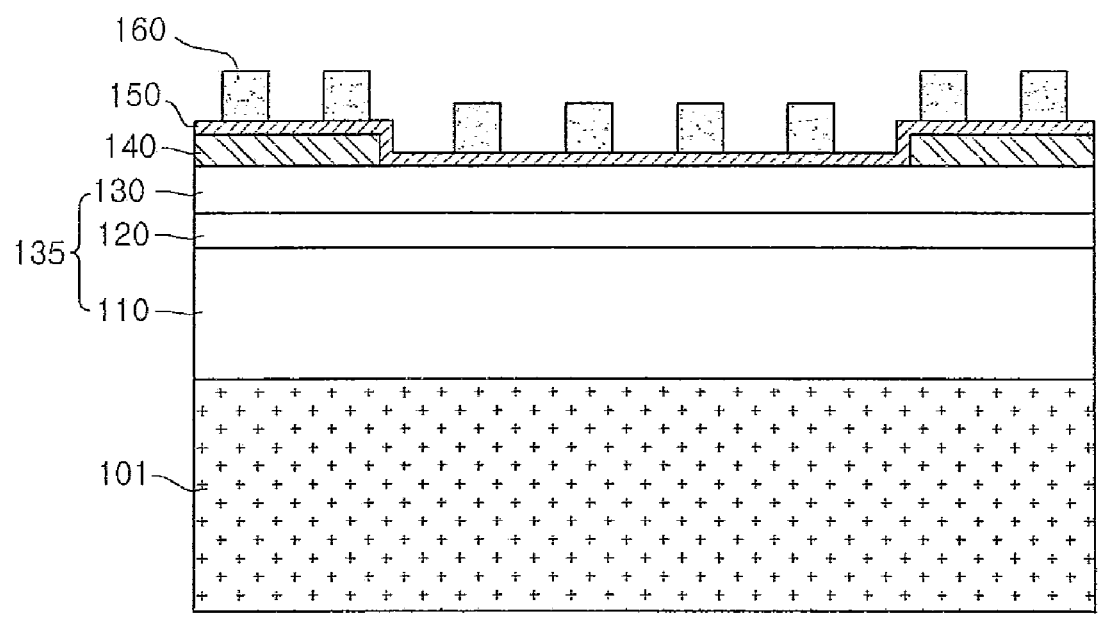

Referring to FIG. 8, a bending prevention member 160 is formed on the electrode layer 150. A mask pattern is used to form the bending prevention member 160 in a predetermined pattern by using at least one selected from the group consisting of sputtering, electron beam deposition, CVD, or PECVD method. The bending prevention member 160 may be formed of a material selectively including a material with a predetermined strength, a heat-resistant material, an insulating material, nitride, and oxide. The bending prevention member 160 may be formed of at least one selected from the group consisting of $SiO_2$, $Si_3N_4$, $Al_2O_3$, $TiO_2$, $SiO_x$, $SiN_x2$, $SiN_x$, and $SiO_xN_y$.

The thickness of the bending prevention member 160 may range from about 100 nm to about 10 µm, and the width may be varied according to the size or electrical characteristics of the chip.

The bending prevention member 160 may be formed in a pattern with a predetermined shape, such as a pattern with a dot matrix shape using, for example, a column shape, a rod shape, a semicircular shape, and a concentric circular shape, a pattern which is crossed at least once such as cross shape or lattice shape, and a pattern with a stripe shape, and the pattern shape may be modified.

Figure 9:
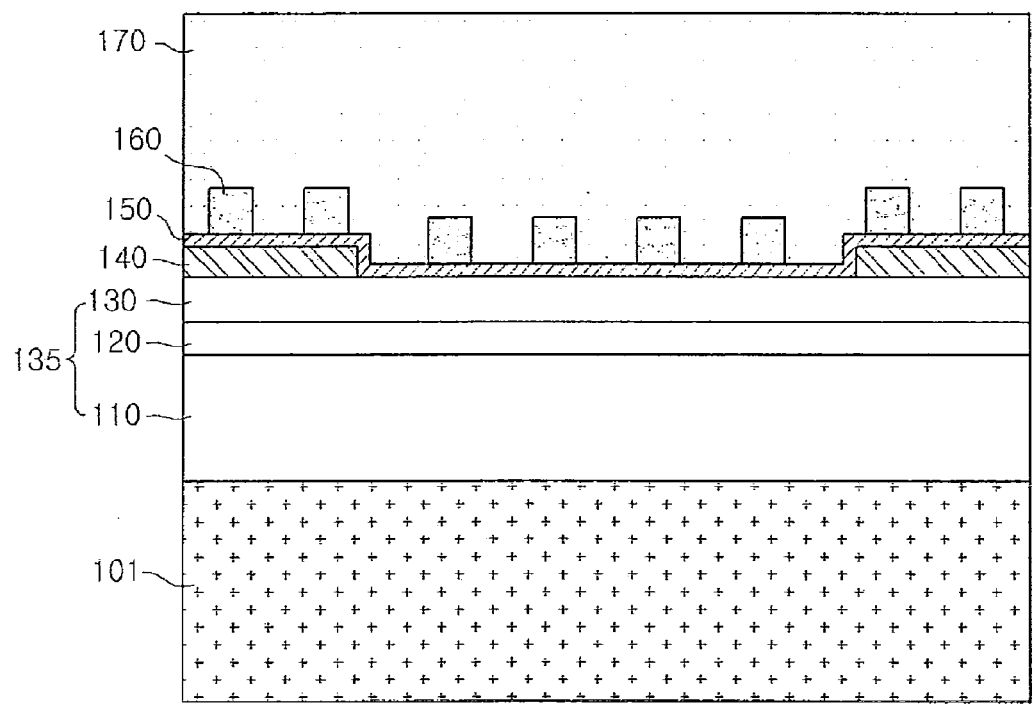

Referring to FIG. 9, a conductive supporting member 170 may be formed on the bending prevention member 160 and the electrode layer 150, the conductive supporting member 170 may function as a base substrate, and its material may include copper (Cu), gold (Au), nickel (Ni), molybdenum (Mo), copper-tungsten (Cu—W), and carrier wafer such as Si, Ge, GaAs, ZnO, SiC, $Ga_2O_3$, SiGe, and GaN. The conductive supporting member 160 may be formed by an electroplating technique or in the form of a sheet, but is not limited thereto. The conductive supporting member 160 may be formed with a thickness of about 30 µm to about 150 µm, but is not limited thereto.

The bending prevention member 160 may be arranged in a pattern shape between the electrode layer 150 as an electrode portion and the conductive supporting member 170 to provide the entire region of the semiconductor light-emitting device 100 with a predetermined strength.

Figure 10:
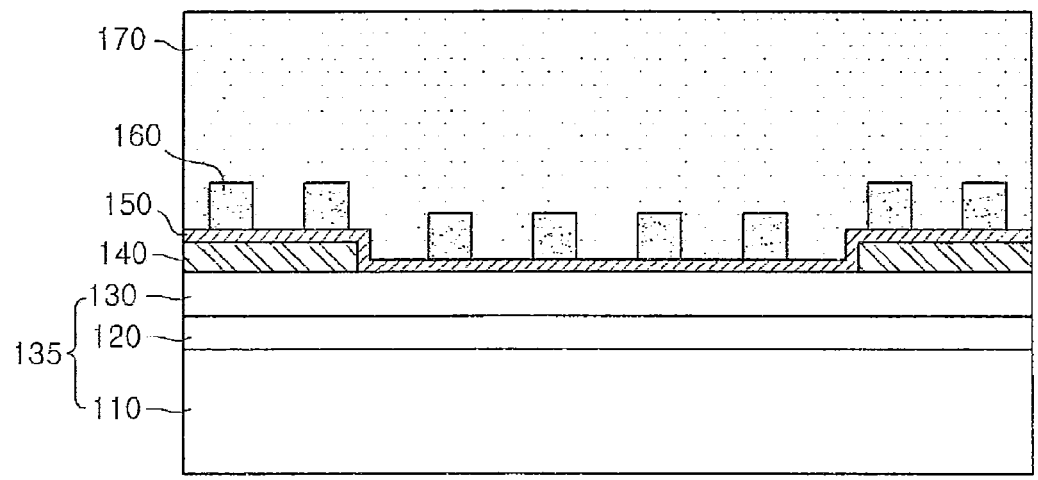

Referring to FIGS. 9 and 10, the conductive supporting member 160 is disposed on the base to remove the substrate 101. The substrate 101 is removed through a physical and/or chemical method.

The physical removal method separates the substrate 101 by irradiating a laser of a predetermined wavelength on the substrate 101 (Laser Lift Off: LLO). In a case where another semiconductor layer (eg: buffer layer) is formed between the substrate 101 and the first conductive semiconductor layer 110, the substrate 101 may be separated by removing the buffer layer through a chemical removal method using a wet etchant.

A etching process may be performed by an inductively coupled plasma/reactive ion etching (ICP/RIE) method on the surface of the first conductive semiconductor layer 110 with the substrate 110 removed.

Figure 11:
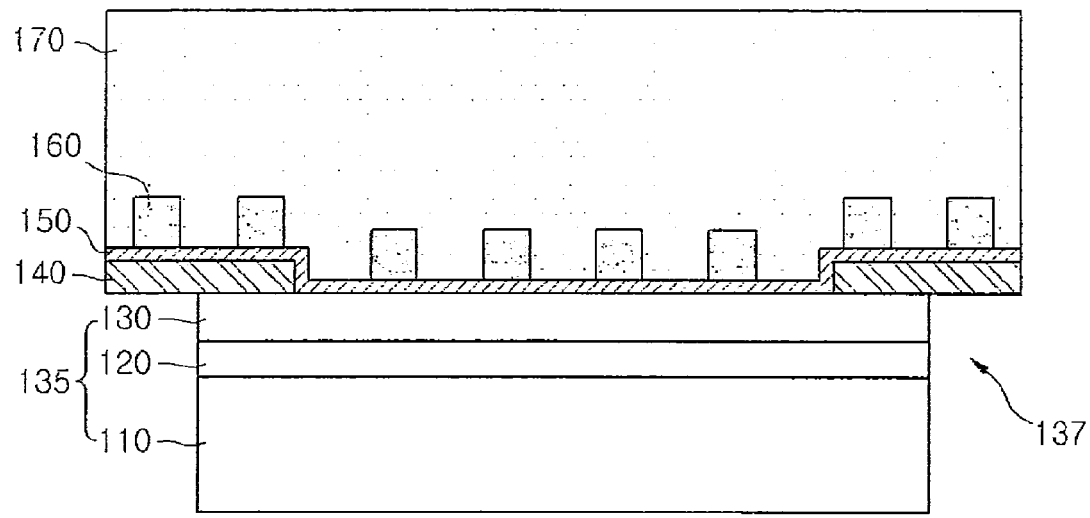
Figure 12:
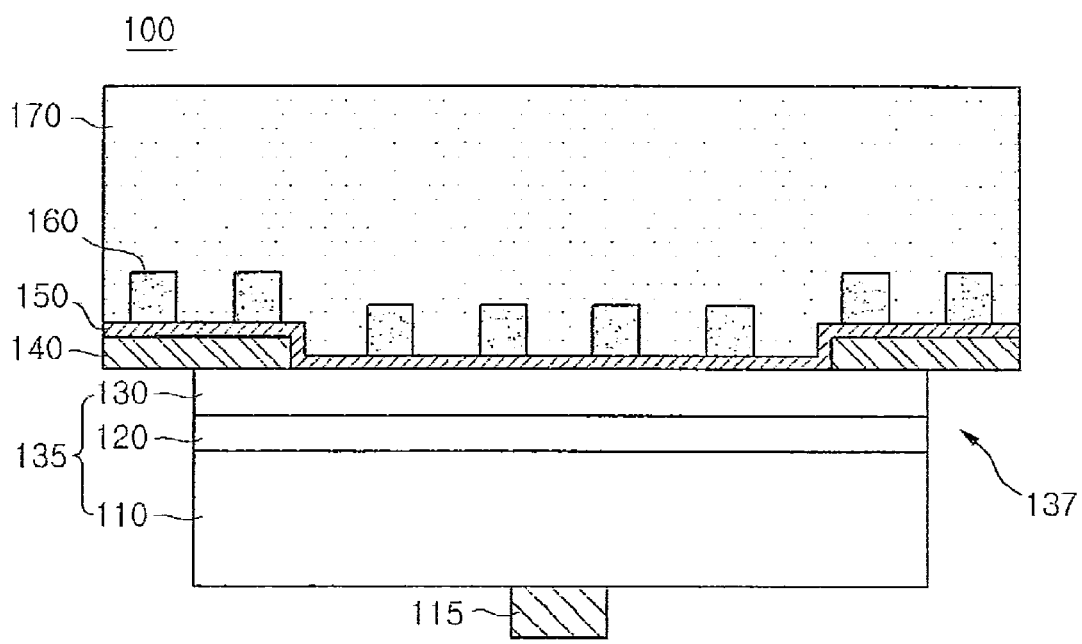

Referring to FIGS. 11 and 12, isolation etching is performed on the chip-to-chip boundary region (ie, channel region) to separate the region into chip units. Then, the outer groove 137 of the light-emitting structure 135 is etched to expose the channel layer 140. In this case, the outer side of the channel layer 140 is exposed to the outer side of the light-emitting structure 135, and the outer side of the channel layer 140 may separate the electrode layer 150 from the side wall of the light-emitting structure 135. Conversely, the light-emitting structure 135 has an effect of being inwardly shifted from the outer wall of the chip.

An electrode 115 is formed under the first conductive semiconductor layer 110. The electrode 115 may be formed in a predetermined shape and a predetermined pattern, but is not limited thereto. The electrode 115 may be formed separately after the formation of electrode or may be used as an electrode, but is not limited thereto.

Herein, a process of forming the electrode 115 may be performed before or after the isolation etching or after the chip separation, but is not limited thereto.

In the semiconductor light-emitting device 100, the conductive supporting member 170 is die-bonded and a wire bonding is performed through the electrode 115. In this case, a shock applied from bonding equipment during the bonding of the electrode 115 is transmitted through the light-emitting structure 135 to the bending prevention member 160. Then, the bending prevention member 160 may support the shock to remove a problem that the semiconductor layer 110, 120, and 130 of the light-emitting structure may be bent. In addition, the bending prevention member 160 may prevent the bending of the LED chip from heat generated by the LED chip. Accordingly, the degradation of chip characteristics, such as fracture or delaminating of the LED chip may be improved.

Figure 13:
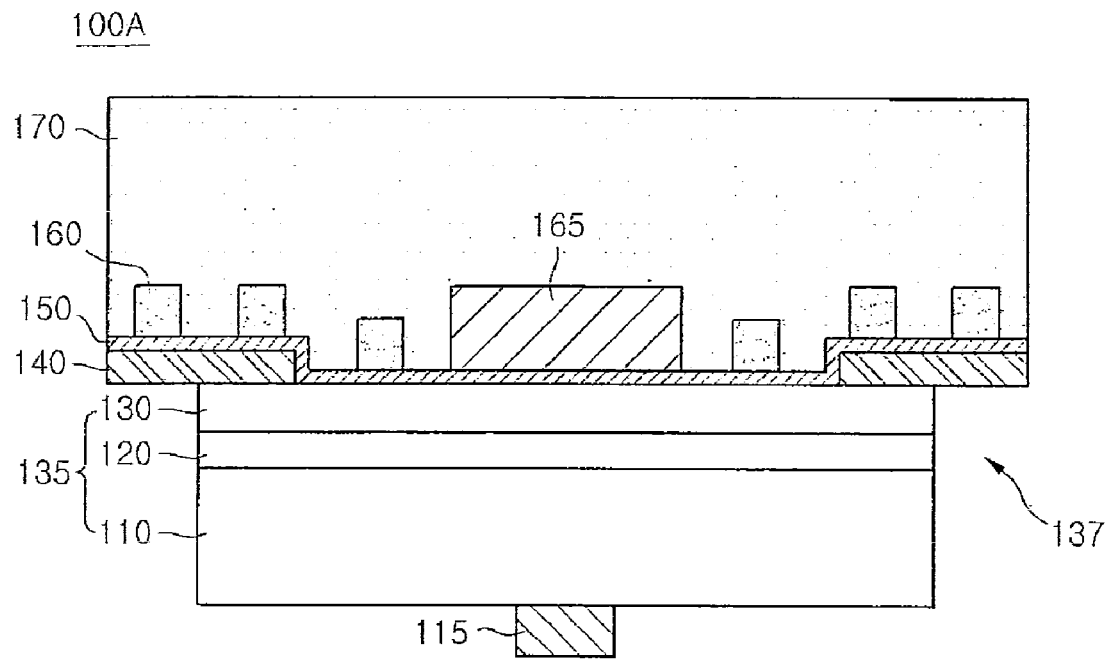
FIG. 13 is a side-sectional view of a semiconductor light-emitting device according to a second embodiment.

FIG. 13 is a side-sectional view of a semiconductor light-emitting device according to a second embodiment. In description of the second embodiment, identical numerals will be used in the portion identical to the first embodiment, and a repeated description will be omitted with reference to the first embodiment.

Referring to FIG. 13, a semiconductor light-emitting device 100An includes a first conductive semiconductor layer 110, an active layer 120, a second conductive semiconductor layer 130, a protective layer 140, an electrode layer 150, a first bending prevention member 160, a second bending prevention member 165, a conductive supporting member 170, and an electrode 115.

A first bending prevention member 160 may be arranged in a plurality of patterns on the electrode layer 150. A detailed description of the first bending prevention member 160 will be conducted with reference to the bending prevention member.

The second bending prevention member 165 is formed on the center region on the electrode layer 150, that is, a region or a position corresponding to the electrode 115.

The second bending prevention member 165 may be formed in a size corresponding to the electrode 115, and may be formed in a circular column shape or a polygonal column shape.

The second bending prevention member 165 may be formed in a high-melting point metal pattern such as W and Mo, and may be formed of a conductive metal material with a high strength. The second bending prevention member 165 is formed of a metal which is higher than a melting point of the electrode layer 150.

The second bending prevention member 165 may be formed with a thickness of at least 1 μm, for example, from about μm to about 10 μm in order to reinforce the strength. In addition, the second bending prevention member 165 may be formed with a thickness identical to a thickness of the first bending prevention member 160 or thicker, and may be formed in numbers corresponding to the numbers of the electrode 115.

The second bending prevention member 165 may be formed on a position corresponding to the electrode 115 to support and protect the LED chip from being bent by a direct shock applied during wire bonding.

Accordingly, degradations of the device characteristics or the chip characteristics caused by fracture or delaminating of a LED chip in a packed device may be improved.

Figure 14:
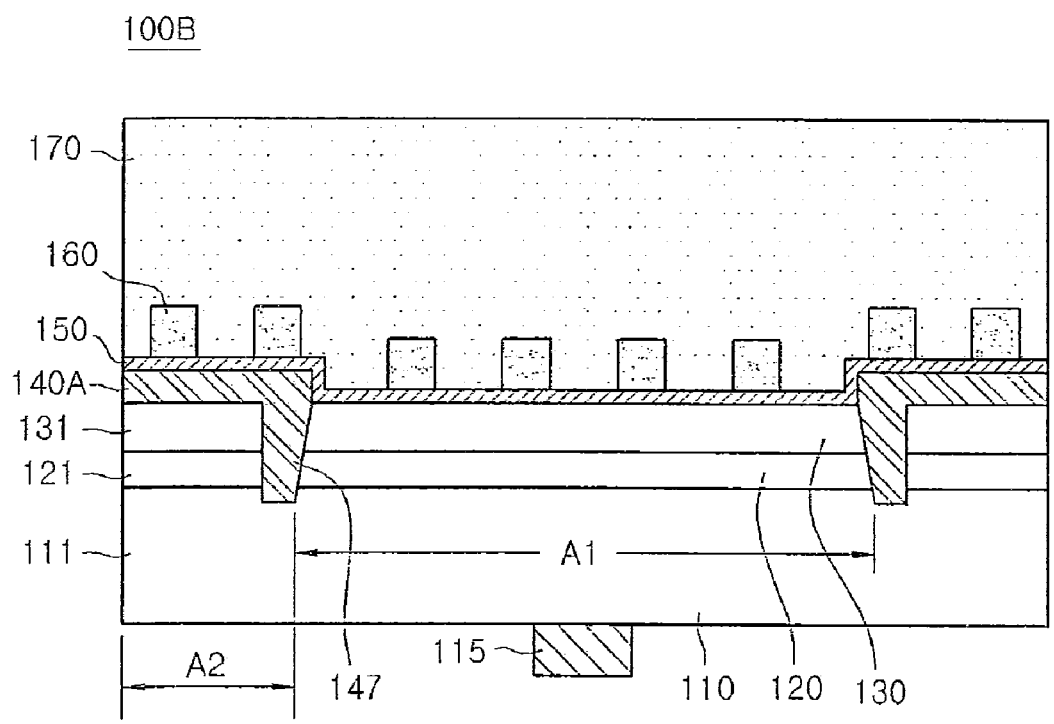
FIG. 14 is a side-sectional view of a semiconductor light-emitting device according to a third embodiment.

FIG. 14 is a side-sectional view of a semiconductor light-emitting device according to a third embodiment. In description of the third embodiment, identical numerals will be used in the portion identical to the first embodiment, and a repeated description about repeated portions will be omitted with reference to the first embodiment.

Referring to FIG. 14, a semiconductor light-emitting device 100B includes a first conductive semiconductor layer 110, an active layer 120, a second conductive semiconductor layer 130, a channel layer 140A, an electrode layer 150, a bending prevention member 160, a conductive supporting member 170, and an electrode 115.

The channel layer 140A may be formed in a continuous pattern with a belt shape, a loop shape, and a frame shape (eg: closed loop shape).

The channel layer 140 may include a transparent insulating layer, for example, at least one selected from the group consisting of $SiO_2$, $SiO_x$, $SiO_xN_y$, $Si_3N_4$, $Al_2O_3$, and $TiO_2$, by using a mask pattern.

An electrode layer 150 is formed on the channel layer 140 and the second conductive semiconductor layer 130, and a bending prevention member 160 is formed on the electrode layer 150.

An protrusion 147 is formed under the inner side of the channel layer 140. The protrusion 147 may be formed with a depth at which the first conductive semiconductor layer 110 is exposed.

The protrusion 147 of the channel layer 140 may be formed in a continuously closed loop shape such as a belt shape or a loop shape, may be formed within a range of about 1 μm to about 5 μm (D1) based on the outer wall of the semiconductor layer 110, 120, and 130, and the range may be varied according to the size of the chip.

The protrusion 147 of the channel layer 140 may separate the light-emitting structure 135 into an active region A1 and an inactive region A2. The semiconductor layer 110, 120, and 130 of the active region A1 is normally operated, while the semiconductor layer 111, 121, and 131 of the inactive region A2 is not normally operated. The first conductive semiconductor layer 111 of the inactive region A2 may be partially used in current path.

Even if the outer semiconductor layer 111, 121, and 131 of the light-emitting structure 135 is shorted, the semiconductor layer 110, 120, and 130 of the active region A1 is normally operated because the protrusion 147 of the channel layer 140 inactivates the outer side of the light-emitting structure 135. In addition, the protrusion 147 of the channel layer 140 may prevent moisture from being penetrated into the outer side of the chip. Because the protrusion 147 of the channel layer 140 may be formed in a single or a double concave-convex structure, it may reinforce adhesive force with the light-emitting structure 135.

Figure 15:
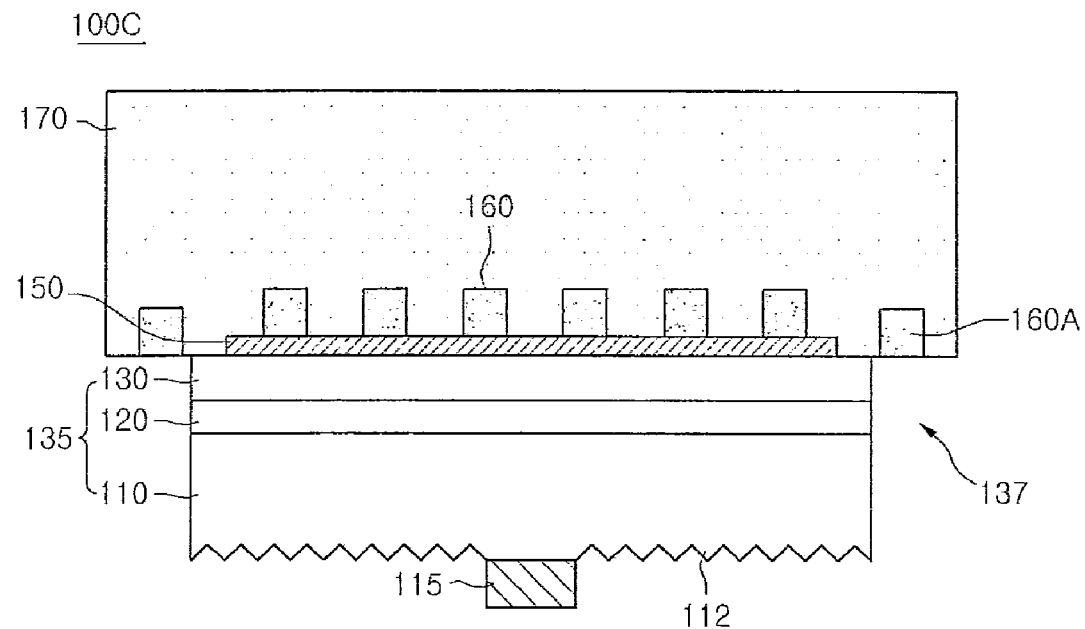
FIG. 15 is a side-sectional view of a semiconductor light-emitting device according to a fourth embodiment.

FIG. 15 is a side-sectional view of a semiconductor light-emitting device according to a fourth embodiment. In description of the fourth embodiment, identical numerals will be used in the portion identical to the first embodiment, and a repeated description about repeated portions will be omitted with reference to the first embodiment.

Referring to FIG. 15, a semiconductor light-emitting device 100C includes a first conductive semiconductor layer 110, an active layer 120, a second conductive semiconductor layer 130, an electrode layer 150, a bending prevention member 160, a conductive supporting member 170, and an electrode 115.

A predetermined roughness 112 may be formed under the first conductive semiconductor layer 110, but the shape is not limited to the roughness 112.

A channel layer 140 in FIG. 1 may not be formed on the second conductive semiconductor layer 130. In this case, the electrode layer 150 may be disposed on the inner region of second conductive semiconductor layer 130 and may be formed not to be exposed to the outer groove 137 of the light-emitting structure 135. Some portions of the bending prevention member 160A may be exposed to the outer groove 137 of the light-emitting structure 135.

Figure 16:
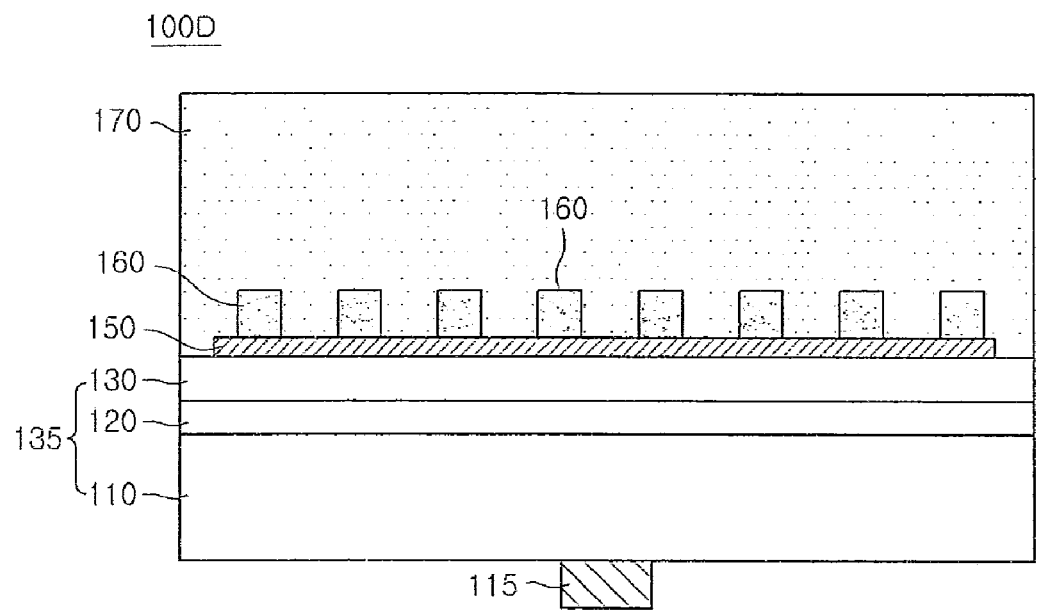
FIG. 16 is a side-sectional view of a semiconductor light-emitting device according to a fifth embodiment.

FIG. 16 is a side-sectional view of a semiconductor light-emitting device according to a fifth embodiment. In description of the fifth embodiment, identical numerals will be used in the portion identical to the first embodiment, and a repeated description about repeated portions will be omitted with reference to the first embodiment.

Referring to FIG. 16, a semiconductor light-emitting device 100D includes a first conductive semiconductor layer 110, an active layer 120, a second conductive semiconductor layer 130, an electrode layer 150, a bending prevention member 160, a conductive supporting member 170, and an electrode 115.

In the semiconductor light-emitting device 100D, a cutting groove may not be formed on the outer wall of the light-emitting structure 135, and the light-emitting structure 135 may be formed in a diameter identical to that of the conductive supporting member 170.

Figure 17:
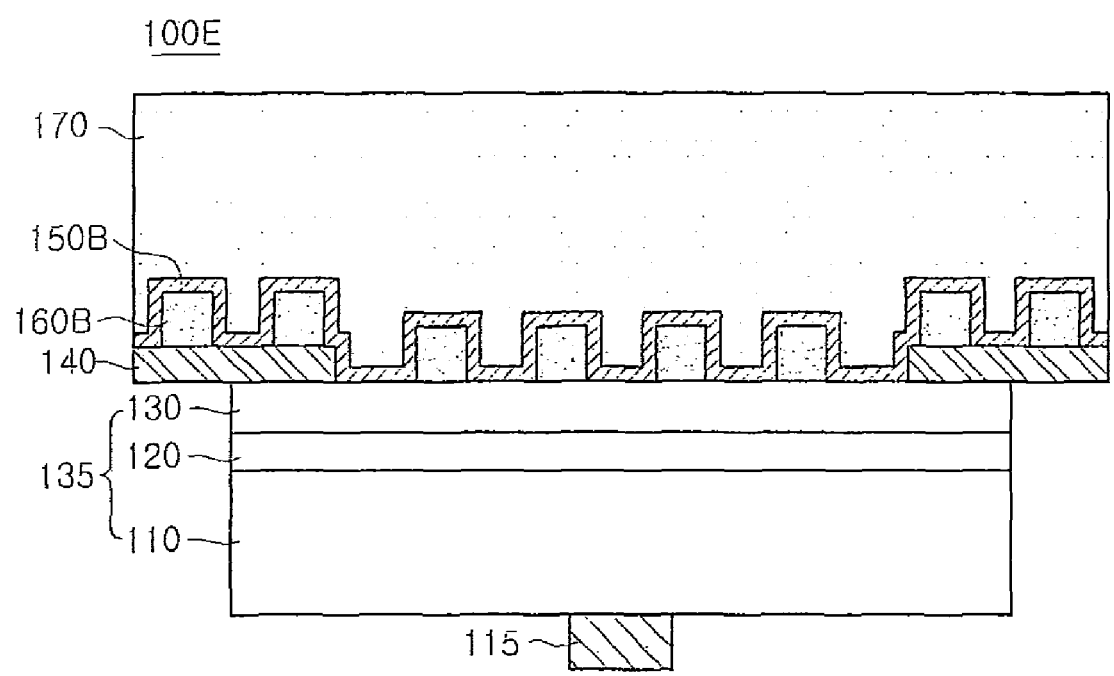
FIG. 17 is a side-sectional view of a semiconductor light-emitting device according to a sixth embodiment.

FIG. 17 is a side-sectional view of a semiconductor light-emitting device according to a sixth embodiment. In description of the sixth embodiment, identical numerals will be used in the portion identical to the first embodiment, and a repeated description about repeated portions will be omitted with reference to the first embodiment.

Referring to FIG. 17, in a semiconductor light-emitting device 100E, a channel layer 140 is formed on the top perimeter of a second conductive semiconductor layer 130, and bending prevention member 160B is formed on the second conductive-semiconductor layer 130 and the channel layer 140. The pattern and material of the bending prevention member 160B are selected with reference to the first embodiment.

In the second conductive semiconductor layer 130, an electrode layer 150B may be formed between the patterns of the bending prevention member 160B. The electrode layer 150B may be formed on the second conductive semiconductor layer 130, and the bending prevention member 160B may or may not be formed. The pattern shape of the bending prevention member 160B may be disposed in a structure almost identical to that of the first embodiment, or may be modified in consideration of electrical characteristics of the electrode layer 150B.

In the electrode layer 150B, a pattern of a high-melting point metal may be formed on a position corresponding to the electrode 115, but is not limited thereto.

The first to the sixth embodiments above disclosed may be selectively applied to other embodiments along with independent characteristics of each embodiment, and may be modified within the technical scope of the embodiment. In addition, characteristics that a bending prevention member discloses may be implemented not only on a substrate of a vertical semiconductor light-emitting device, but also on a substrate of the horizontal semiconductor light-emitting device as characteristics of the embodiments.

An embodiment provides a method for manufacturing a semiconductor light-emitting device, the method comprising: forming a light-emitting structure comprising a first conductive semiconductor layer, an active layer, and a second conductive semiconductor layer; forming an electrode layer on the second conductive semiconductor layer; forming a bending prevention member which is arranged in a plurality of patterns on the electrode layer; forming an electrode under the light-emitting structure; and forming a conductive supporting member on the bending prevention member and the electrode layer.

Embodiments can provide an effect that an LED chip is prevented from being bent by a shock caused by bonding.

Embodiments can prevent degradation of LED chip characteristics from a shock by bonding.

Embodiments can minimize the bending of an LED chip caused by heat.

Embodiments can improve adhesive force between a semiconductor layer and another layer.

Embodiments can prevent interlayer short defects of a plurality of compound semiconductor layers.

Embodiments can prevent a short problem caused by penetration of moisture into a plurality of compound semiconductor layers.

Embodiments can improve the reliability of a vertical semiconductor light-emitting device.

Embodiments can provide a semiconductor light-emitting device like LED.

Embodiments can improve the electrical reliability of the semiconductor light-emitting device.

Embodiments can improve the light efficiency of a vertical semiconductor light-emitting device.

Embodiments can apply a light source including a packaged semiconductor light-emitting device to an illumination field, an indication field, and a display field.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor light-emitting device, comprising:
a plurality of compound semiconductor layers including a first conductive semiconductor layer; an active layer on the first conductive semiconductor layer; and a second conductive semiconductor layer on the active layer;
an electrode under the plurality of compound semiconductor layers;
an electrode portion on the plurality of compound semiconductor layers;
a bending prevention member comprising a pattern on the plurality of compound semiconductor layers; and
a channel layer comprising a continuous pattern on the top perimeter of the second conductive semiconductor layer.

2. The semiconductor light-emitting device according to claim 1, wherein:
the electrode portion comprises an electrode layer on the plurality of compound semiconductor layers;
a conductive supporting member on the electrode layer; and
the bending prevention member is arranged between the electrode layer and the conductive supporting member.

3. The semiconductor light-emitting device according to claim 1, wherein the bending prevention member comprises a nitride-based insulating material or an oxide-based insulating material.

4. The semiconductor light-emitting device according to claim 1, wherein the bending prevention member comprises a plurality of first bending prevention patterns including an insulating material; and a second bending prevention pattern corresponding to the electrode.

5. The semiconductor light-emitting device according to claim 4, wherein the second bending prevention pattern is formed of a metal which has a higher melting point than a melting point of a material of the electrode portion.

6. The semiconductor light-emitting device according to claim 2, wherein the bending prevention member comprises at least one selected from the group consisting of $SiO_2$, $Si_3N_4$, $Al_2O_3$, $TiO_2$, $SiO_x$, $SiN_x2$, $SiN_x$, and $SiO_xN_y$.

7. The semiconductor light-emitting device according to claim 2, wherein the bending prevention member comprises at least one selected from the group consisting of patterns of a stripe shape, a zigzag shape, a shape in which a plurality of patterns are crossed at least once, a dot matrix shape, and a lattice shape.

8. The semiconductor light-emitting device according to claim 2, wherein the bending prevention member comprises at least one selected from the group consisting of W and Mo.

9. The semiconductor light-emitting device according to claim 8, the bending prevention member has a thickness of about 1 μm to about 10 μm.

10. The semiconductor light-emitting device according to claim 1,
wherein the channel layer comprises at least one selected from the group consisting of $SiO_2$, $SiO_x$, $SiO_xN_y$, $Si_3N_4$, $Al_2O_3$, $TiO_2$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IrOx, RuOx, RuOx/ITO, Ni/IrOx/Au, and Ni/IrOx/Au/ITO.

11. The semiconductor light-emitting device according to claim 1, wherein the bending prevention member is arranged between the electrode portion and the plurality of the compound semiconductor layers.

12. The semiconductor light-emitting device according to claim 1, wherein a part of the bending prevention member is exposed around the circumference region of the plurality of compound semiconductor layers.

13. A semiconductor light-emitting device, comprising:
a plurality of compound semiconductor layers including a first conductive semiconductor layer; an active layer on the first conductive semiconductor layer; and a second conductive semiconductor layer on the active layer;
an electrode under the plurality of compound semiconductor layers;
an reflective electrode layer on the plurality of compound semiconductor layers;
a conductive supporting member on the reflective electrode layer;
a first bending prevention member comprising a pattern formed between the reflective electrode layer and the conductive supporting member; and
a channel layer disposed on a peripheral portion of the plurality of the compound semiconductor layers.

14. The semiconductor light-emitting device according to claim 13, comprising an N-type semiconductor layer formed between the reflective electrode layer and second conductive semiconductor layer.

15. The semiconductor light-emitting device according to claim 13, comprising a roughness under the first conductive semiconductor layer.

16. The semiconductor light-emitting device according to claim 13, wherein the first bending prevention member comprises at least one selected from the group consisting of $SiO_2$, $Si_3N_4$, $Al_2O_3$, $TiO_2$, $SiO_x$, $SiN_x2$, $SiN_x$, and $SiO_xN_y$.

17. The semiconductor light-emitting device according to claim 13, comprising a second prevention member including a pattern corresponding to a plurality of electrodes and formed of a metal material.

18. The semiconductor light-emitting device according to claim 17, wherein the second bending prevention member is formed thicker than the pattern thickness of the first bending prevention member.

19. The semiconductor light-emitting device according to claim 17, comprising:
an ohmic contact layer comprising a layer or a pattern between the second conductive semiconductor layer and the electrode layer.

20. The semiconductor light-emitting device according to claim 13, wherein the channel layer is formed of a transparent insulating material and extended to the outer side of the second conductive semiconductor layer.

* * * * *